(12) United States Patent
Dunipace (10) Patent No.: US 8,981,819 B2
(45) Date of Patent: *Mar. 17, 2015

(54) PROPORTIONAL BIAS SWITCH DRIVER CIRCUIT WITH CURRENT TRANSFORMER

(75) Inventor: Richard A Dunipace, Highland Village, TX (US)

(73) Assignee: Fairchild Semiconductor Corporation, San Jose, CA (US)

( * ) Notice: Subject to any disclaimer, the term of this patent is extended or adjusted under 35 U.S.C. 154(b) by 192 days.

This patent is subject to a terminal disclaimer.

(21) Appl. No.: 13/336,136

(22) Filed: Dec. 23, 2011

(65) Prior Publication Data

US 2013/0162303 A1   Jun. 27, 2013

(51) Int. Cl.
*H03K 3/00* (2006.01)

(52) U.S. Cl.
USPC ............................ 327/109; 327/309; 327/432

(58) Field of Classification Search
USPC .......................................... 327/110, 432, 535
See application file for complete search history.

(56) References Cited

U.S. PATENT DOCUMENTS

| | | | |
|---|---|---|---|
| 4,132,925 A * | 1/1979 | Schmutzer et al. | 315/208 |
| 4,187,458 A * | 2/1980 | Milberger et al. | 323/286 |
| 4,586,004 A | 4/1986 | Valdez | |
| 4,663,570 A * | 5/1987 | Luchaco et al. | 315/219 |
| 4,680,534 A | 7/1987 | Tanaka et al. | |
| 4,709,321 A | 11/1987 | Trantham | |
| 4,763,061 A | 8/1988 | Schwarz | |
| 4,808,853 A | 2/1989 | Taylor | |
| 5,418,702 A | 5/1995 | Marinus et al. | |
| 5,469,029 A * | 11/1995 | Jackson et al. | 315/408 |
| 6,430,071 B1 * | 8/2002 | Haneda | 363/127 |
| 2013/0044527 A1 * | 2/2013 | Vracar et al. | 363/131 |

OTHER PUBLICATIONS

STMicroelectronics "STESB01 Datasheet," dated Oct. 2006 (14 pages).

* cited by examiner

*Primary Examiner* — Ryan Jager
(74) *Attorney, Agent, or Firm* — Grossman Tucker Perreault & Pfleger LLC (57) ABSTRACT

A switch bias system is provided that includes a bipolar junction transistor (BJT) switch comprising a base, emitter, and collector; an energy storage circuit coupled to the collector of the BJT, the energy storage circuit supplying current flow to the collector of the BJT; a current transformer circuit coupled to the emitter, the current transformer circuit configured to sense current flow through the emitter of the BJT switch; and a proportional bias circuit configured to generate a bias current to the base of the BJT switch, the bias current set to a proportion of the sensed current flow through the emitter of the BJT switch.

15 Claims, 5 Drawing Sheets

PROPORTIONAL BIAS SWITCH DRIVER CIRCUIT WITH CURRENT TRANSFORMER

FIELD

The present disclosure relates to switch driver circuits, and more particularly, to proportional bias switch driver circuits with current transformers.

BACKGROUND

Switched mode power supplies (SMPS), such as buck converters, boost converters, buck-boost converters and flyback converters perform alternating current (AC) to direct current (DC) conversions as well as DC to DC conversions with voltage level transformations from input to output. These types of power supply converters generally employ switching devices such as bipolar junction transistors (BJTs) or metal oxide semiconductor field effect transistors (MOSFETs) where the switching frequencies and pulse widths are modulated to control operational parameters of the converter.

The use of BJTs instead of MOSFETs in the converter design can result in reduced cost and increased efficiency in higher voltage applications, for example greater than 700 volts. BJTs, however, generally have slower switching speeds than MOSFETs and therefore cannot operate in the higher frequency ranges that are required for some applications. BJTs also require greater control over the gate drive biasing to reduce switching losses, saturation losses and storage time, which can be difficult to achieve.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

Generally, this disclosure provides circuits, systems and methods for supplying a proportional bias current to a BJT switch in an SMPS driver circuit, the bias being proportional to the current flowing through the BJT switch. Providing a fixed proportional bias current to the BJT switch may improve saturation, reduce storage time and increase efficiency of the BJT switch. The proportional bias current generation may be based on a current transformer coupled to the emitter of the BJT switch. In some embodiments, the proportional bias driver may be used to provide bias to Silicon on Carbide (SiC) switches or to emitter switched BJT/MOSFET Cascode switches (ESBC™, a trademark of Fairchild Semiconductor Corp.). In some embodiments, the proportional bias driver may be used to provide bias to power switches that incorporate BJT or BJT Sic switches, to motor drivers or to ignition switches (e.g., motor drive controller 199).

Figure 1:
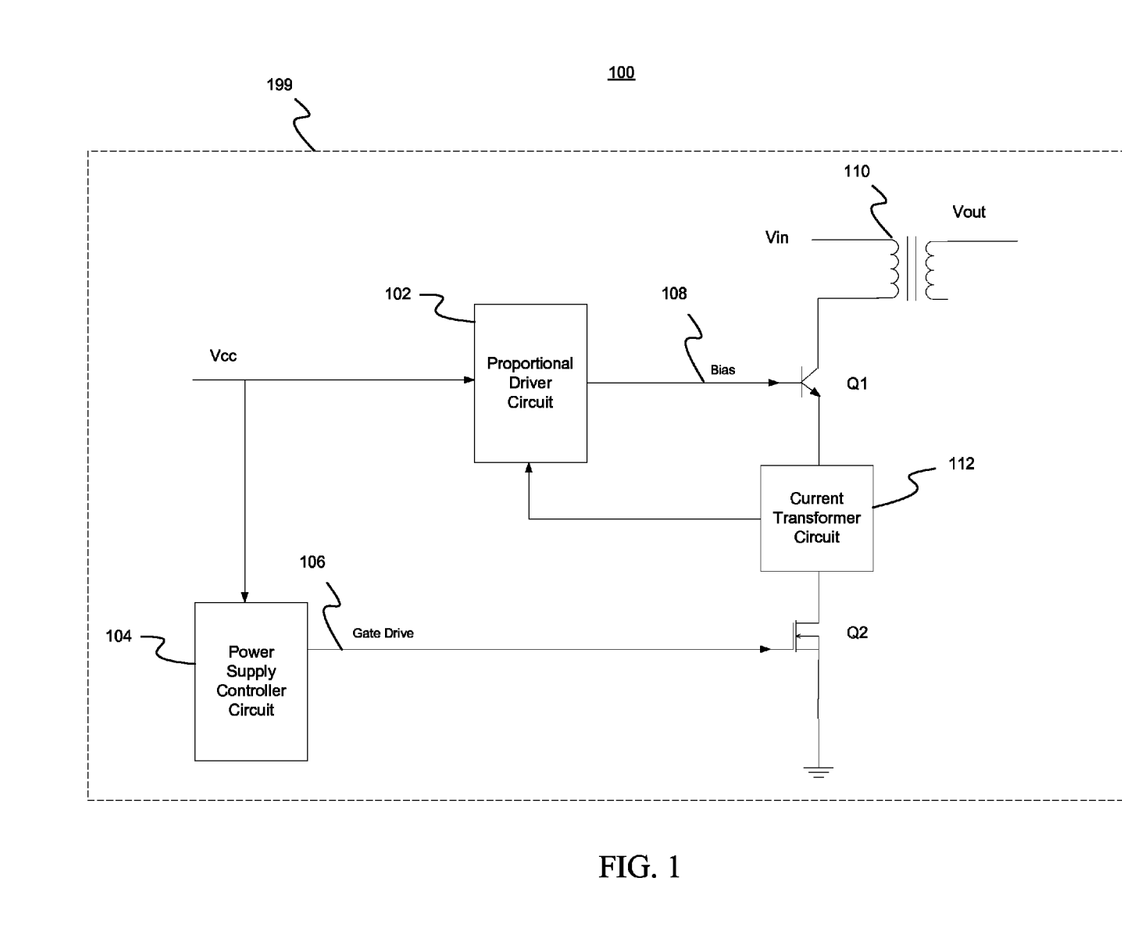
FIG. 1 illustrates a system block diagram of one exemplary embodiment consistent with the present disclosure.

FIG. 1 illustrates a system block diagram 100 of one exemplary embodiment consistent with the present disclosure. Proportional driver circuit 102 and current transformer circuit 112 are shown as components in a switched mode power supply 199 configured as a flyback converter, although other types of AC-DC or DC-DC converters maybe used. These types of converters can include a switch, e.g. a transistor Q1/Q2, which is selectively operated to allow energy to be stored in an energy storage device, e.g. an inductor or transformer winding 110, and then transferred to one or more outputs such as a capacitor (not shown in FIG. 1) that smooth the DC output voltage Vout to the load and provide essentially continuous energy to the load between energy storage cycles. The stored energy may also be used without rectification or filtering to power a load.

The collector of switch Q1, a BJT transistor, is coupled to one side of the transformer primary 110, and the input voltage Vin is coupled to the other side of transformer primary 110. The emitter of switch Q1 is coupled to current transformer circuit 112 which is in turn coupled to the drain of MOSFET switch Q2 such that switches Q1 and Q2 are in series. The series combination of BJT switch Q1 and MOSFET switch Q2 in this configuration may comprise an ESBC™ switch. A cascode is a two stage amplifier which is configured to improve input/output isolation, frequency of operation, and overall improved performance. The source of MOSFET switch Q2 is coupled to ground. In some embodiments, the ESBC switch may include a low voltage, high performance MOSFET in series with a high-voltage BJT. Of course, other transistor technologies may be used, for example, SiC (silicon on carbide), etc.

BJT switch Q1 may be configured to handle relatively large voltage drops between collector and emitter. In some embodiments this Q1 voltage may range from less than 1 volt to greater than 700 volts. MOSFET switch Q2, however, may be configured to handle relatively smaller voltage drops between drain and source. In some embodiments this Q2 voltage may be in the range of 20 to 40 volts. The ESBC™ switch may therefore be used advantageously in higher or wider ranging voltage switching applications.

The control of the switching times for switch Q2 is provided through a gate drive signal 106 supplied by a power supply controller circuit 104. In some embodiments, power supply controller circuit 104 may be a FAN7601 controller sold by Fairchild Semiconductor Corporation. Power supply controller circuit 104 modulates gate drive signal 106 causing switch Q2 to turn on and off which regulates the current flow through both Q1 and Q2. The modulation may be frequency modulation, pulse width modulation or any other suitable modulation type.

MOSFET switch Q2 is generally capable of higher switching rates than BJT switch Q1 so the series combination of Q1 and Q2 into an ESBC™ switch advantageously provides increased switching speeds along with increased voltage handling capability. In order for the ESBC™ switch to operate efficiently, however, the bias for switch Q1 may be dynamically controlled in response to changing load conditions. Proportional driver circuit 102 provides this function by monitoring current sense feedback generated by current transformer circuit 112 and adjusting the bias signal 108 to switch Q1 such that the bias signal is maintained as a proportion of the current flow through Q1. The proportion can be set based on the winding turns ratio of the current transformer circuit 112. By choosing the proper winding turns ratio for the proportional biasing, which depend on operational parameters of the switch Q1, performance of the switch can be optimized by reducing storage time, switching losses and saturation losses and increasing efficiency.

Figure 2:
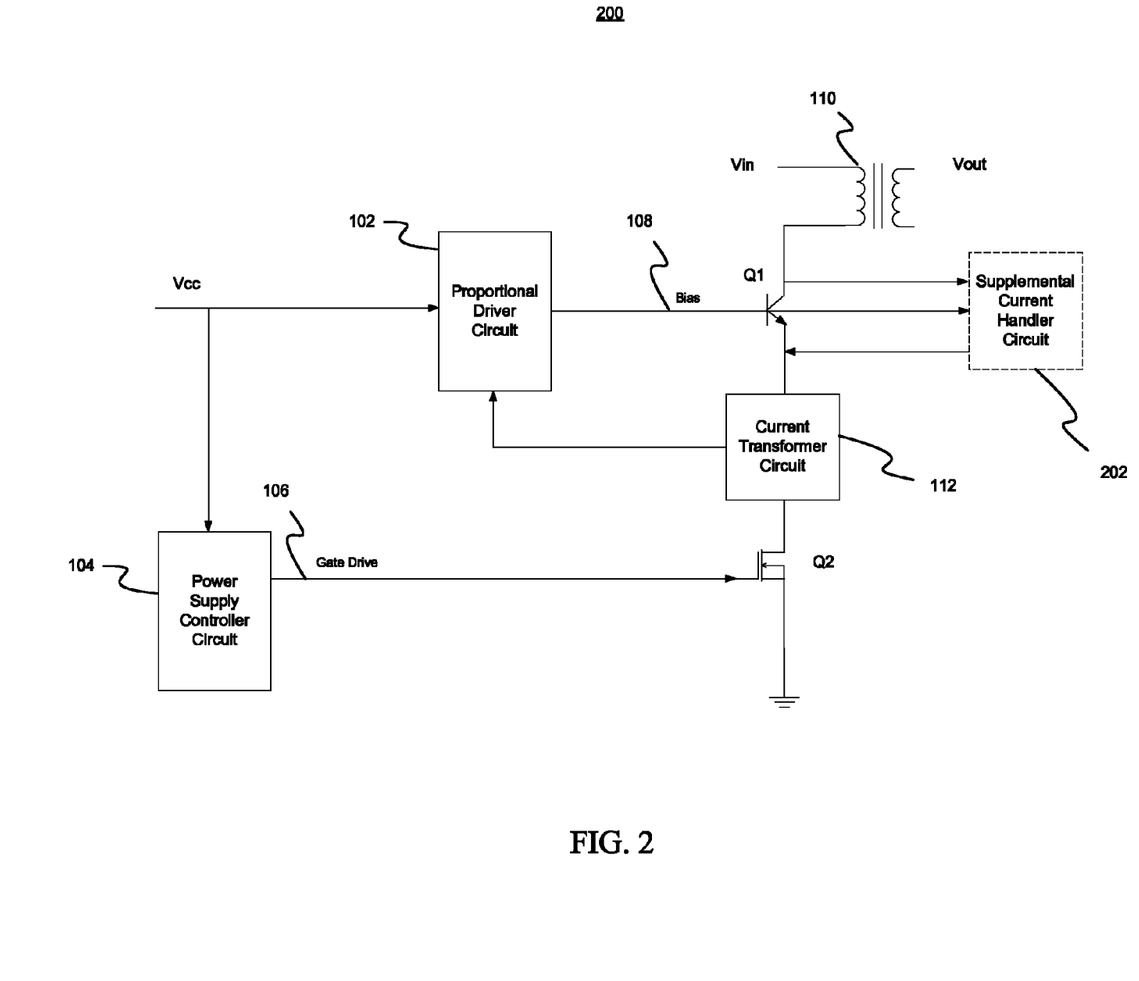
FIG. 2 illustrates a system block diagram of another exemplary embodiment consistent with the present disclosure.

FIG. 2 illustrates a system block diagram 200 of another exemplary embodiment consistent with the present disclosure. FIG. 2 shows the system 100 from FIG. 1 with the addition of an optional supplemental current handler circuit 202. The supplemental current handler circuit 202 provides one or more additional switched current flow paths that add to the current handling capability as will be explained in greater detail below. FIG. 2 also illustrates that a single driver may be used to set the bias for many current handlers thus reducing the overall system cost since the driver does not have to duplicated for each current handler.

Figure 3:
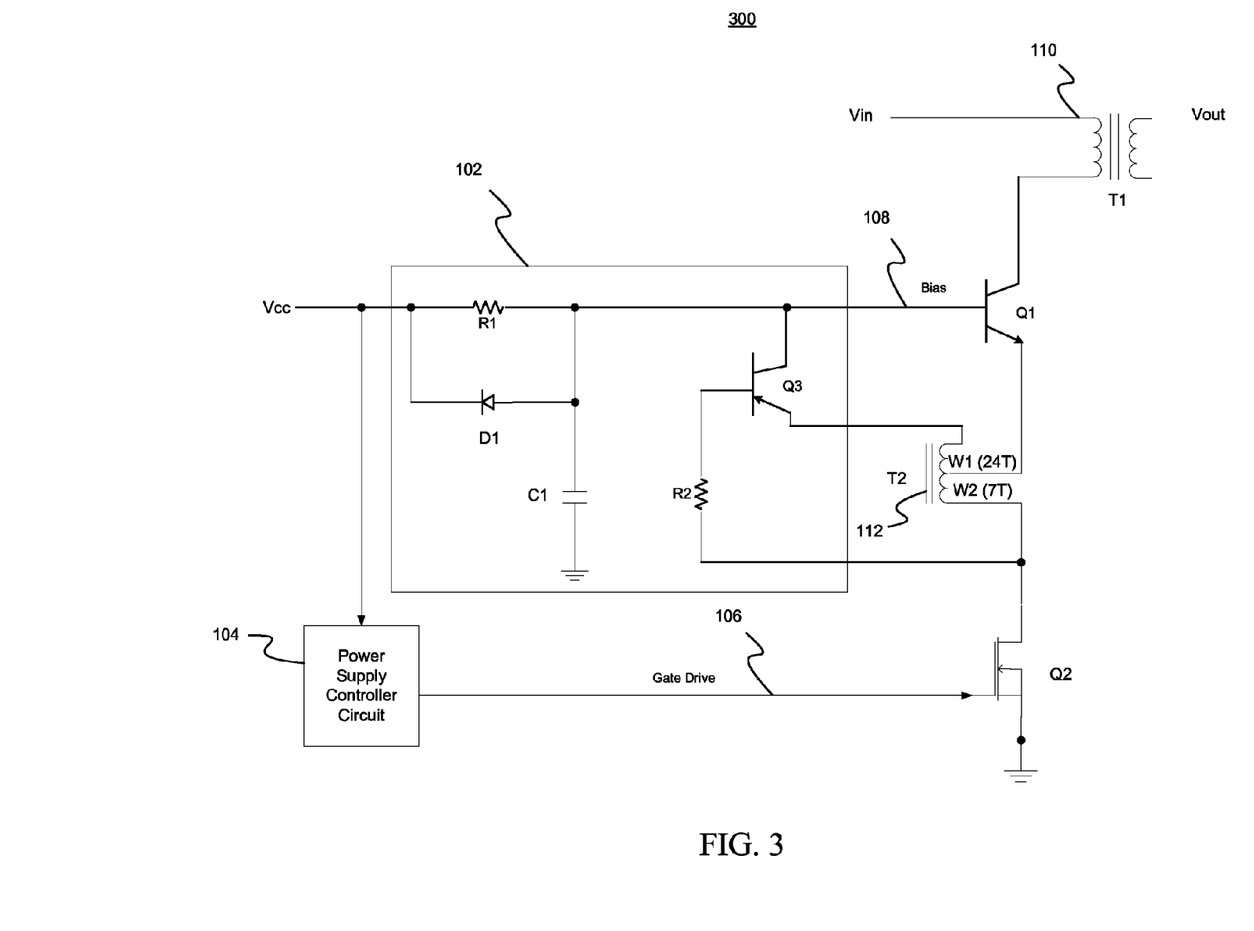
FIG. 3 illustrates a circuit diagram of one exemplary embodiment consistent with the present disclosure.

FIG. 3 illustrates a circuit diagram 300 of one exemplary embodiment consistent with the present disclosure. Proportional driver circuit 102 is illustrated in greater detail and includes transistor Q3, resistors R1, R2, capacitor C1 and diode D1. Current transformer T2 112 is also shown. While the present embodiment uses BJTs and/or MOSFETs, any combination of BJTs and MOSFETs may be used to realize this function.

Initially, as the system turns on, the gate drive 106, from power supply controller circuit 104, is low and there is no current flowing through Q1, Q2, Q3 or the transformer T1 primary 110. As the supply voltage Vcc is applied, capacitor C1, is charged up to voltage level Vcc through resistor R1. Vcc may be derived from input voltage Vin. When Vcc reaches the required startup voltage for power supply controller circuit 104, the first gate drive pulse 106 is generated which turns on switch Q2. As switch Q2 turns on, the voltage at the drain of Q2 falls which forward biases the base-emitter junction of switch Q1 which turns switch Q1 on. This produces a voltage drop across both transformers T1 110 and T2 112. The initial base-emitter drive current for switch Q1 is provided by capacitor C1.

As current begins to flow through transformer T1 from Vin, due to the conduction of switches Q1 and Q2 to ground, current also starts to flow through transformer T2 generating a voltage drop across winding 2 (W2). This voltage is stepped up based on the turns ratio of winding 2 to winding 1 (W2/W1). In some embodiments, and for illustrative purposes, winding 1 may be 24 turns (24T) and winding 2 may be 7 turns (7T). The 24 turn winding is connected in phase with the 7 turn winding such that a 1 volt drop across the 7 turn winding generates a 3.43 volt drop across the 24 turn winding which is cumulative to the voltage across the 7 turn winding. Thus, a total of 4.43 volts would be applied between the emitter of switch Q3 and the drain of switch Q2. The voltage on the 7 turn winding is positive at the connection to the emitter of switch Q1 and negative at the connection to the drain of switch Q2. The positive voltage applied to the emitter of switch Q3 versus the voltage applied to the base of switch Q3 through resistor R2 turns on switch Q3. Resistor R2 limits the base-emitter current for switch Q3.

When switch Q3 is in a conducting state, transformer T2 becomes electrically coupled to the base of switch Q1. This clamps the maximum voltage that may exist across the transformer T2. The base-emitter voltage of a BJT is approximately 0.7 volts.

The addition of a typical resistive voltage drop raises this to a total of approximately 0.8 volts. The voltage across switch Q3 adds to the allowable voltage on transformer T2 and depends upon switch Q3's conduction and drive current. If the voltage drop across switch Q3 is limited to 0.2 volts and the voltage across the emitter-base junction of switch Q1 is 0.8 volts, the total voltage across transformer T2 would be 1 volt. This voltage would be distributed across transformer T2 based upon the turns ratio (W2/W1) assuming the transformer core is not saturated and the resistance of the wire used to wind the transformer has zero impedance. Thus, in the case of a 1 volt drop across transformer T2, from the emitter of Q3 to the drain of Q2, the voltage drop from the emitter of Q1 to the drain of Q2 would be 0.226 volts.

Clamping the voltage across transformer T2 limits the transformer core magnetic saturation which allows the core to carry more current for a given core size. Clamping also reduces the core recovery time to allow faster switching. Additionally, clamping causes the transformer to operate in current mode rather than voltage mode which further increases the transformer speed since fewer turns are required which lowers inductance.

The value of resistor R1 may be set relatively high, because bias for switch Q1 is derived from the current transformer T2, and associated circuitry, once ESBC switch conduction is initiated. As described previously, the charge on capacitor C1 starts the initial conduction of the ESBC switch. When the gate drive from the power supply controller circuit 104 goes low this turns off switch Q2. When switch Q2 turns off, the emitter of switch Q1 is opened and current flowing through Q1 is discharged through the base of Q1 reverse biasing the emitter-base of Q1 and recharging capacitor C1. The maximum voltage on switch Q3 is clamped to one diode junction voltage above Vcc by diode D1. Thus, the turn off current recharges capacitor C1 and adds charge to any Vcc power supply storage capacitors resulting in a power saving.

As described previously, transformer T2 operates in current mode. The turns ratio (W2/W1) of transformer T2 sets the current drive level for switch Q1 proportional to the emitter current of switch Q1. Thus, there is a correspondence between emitter current and base drive current which provides an improved bias of the BJT switch Q1. BJTs are minority current devices and therefore have faster switching speeds when properly biased. Ideally, they should be driven with no more bias current than that which is required to produce the desired saturation. The greater the bias for any given level of conduction, the greater the time required for the BJT to switch off since current carriers need to migrate from the device at turn off which takes time. This effect is called storage time.

The Q1 switch current level is sensed at the emitter to reduce the cost, size and complexity of the current transformer design. The voltage at the emitter of switch Q1 is relatively low thus requiring less cost in the winding insulation of transformer T2, reduced spacing between windings to avoid flashover and simpler design. The voltages on the collector can be much higher in comparison. The transformer may be wound as an autotransformer (where a single winding is divided into a primary and secondary section) and can be a single tapped winding in some embodiments which can lower manufacturing cost further. Additionally, there is no requirement for primary to secondary insulation allowing further cost reduction. Finally, since the number of turns is reduced in this approach and core saturation is reduced, a toroid transformer may be used which can be mass produced economically.

Switch Q3 operates as a synchronous rectifier in the proportional driver to improve driver efficiency. This also allows the emitter of Q1 to be more positive than the base after turn off which produces a reverse bias on Q1 for switching to Vcbo voltages.

In some embodiments, switch Q3, resistor R2 and transformer T2 may be integrated into a single proportional driver module. In some embodiments, switch Q3, resistor R2, transformer T2 and ESBC cascode switch combination Q1/Q2 may be integrated into a single proportional driver and ESBC switch combination module.

Figure 4:
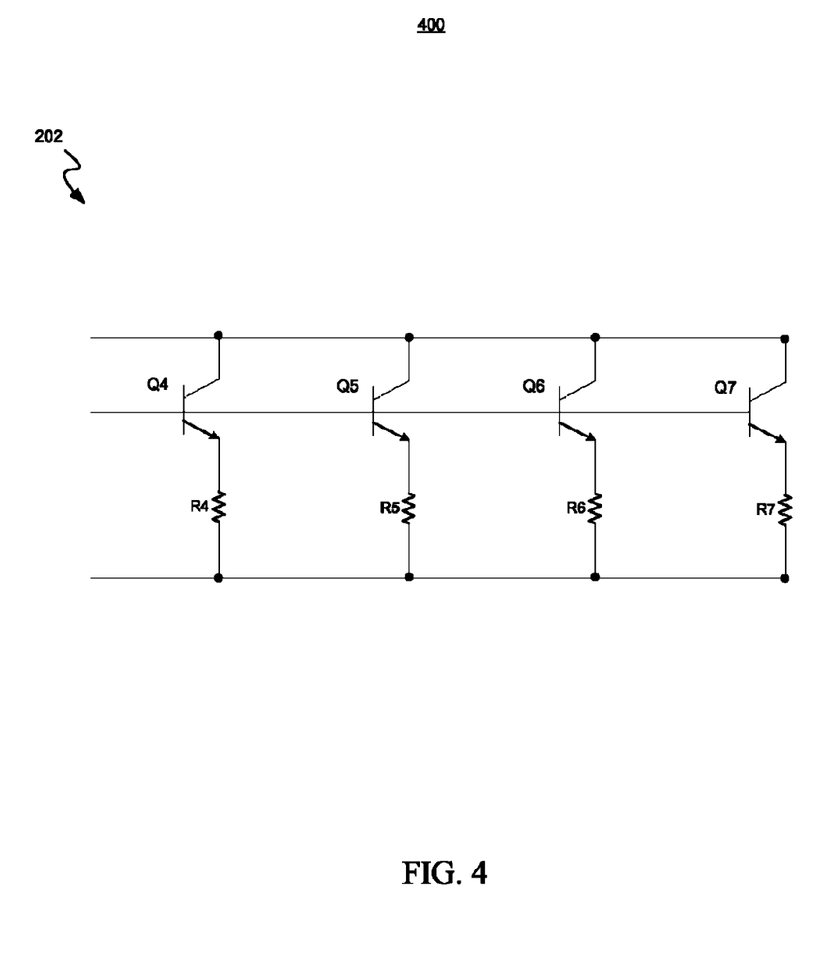
FIG. 4 illustrates a circuit diagram of another exemplary embodiment consistent with the present disclosure.

FIG. 4 illustrates a circuit diagram 400 of another exemplary embodiment consistent with the present disclosure. Supplemental current handler circuit 202 is shown in greater detail. The supplemental current handler circuit 202 provides one or more additional switched current flow paths through switches Q4-Q7 in series with resistors R4-R7 that add to the current handling capability of the system. Resistors R4-R7 may be used to balance the drive current across all switches. In some embodiments switches Q4-Q7 may be BJT switches. The use of supplemental current handlers can allow a single proportional driver to provide the drive bias for many BJTs, thus reducing system cost.

Figure 5:
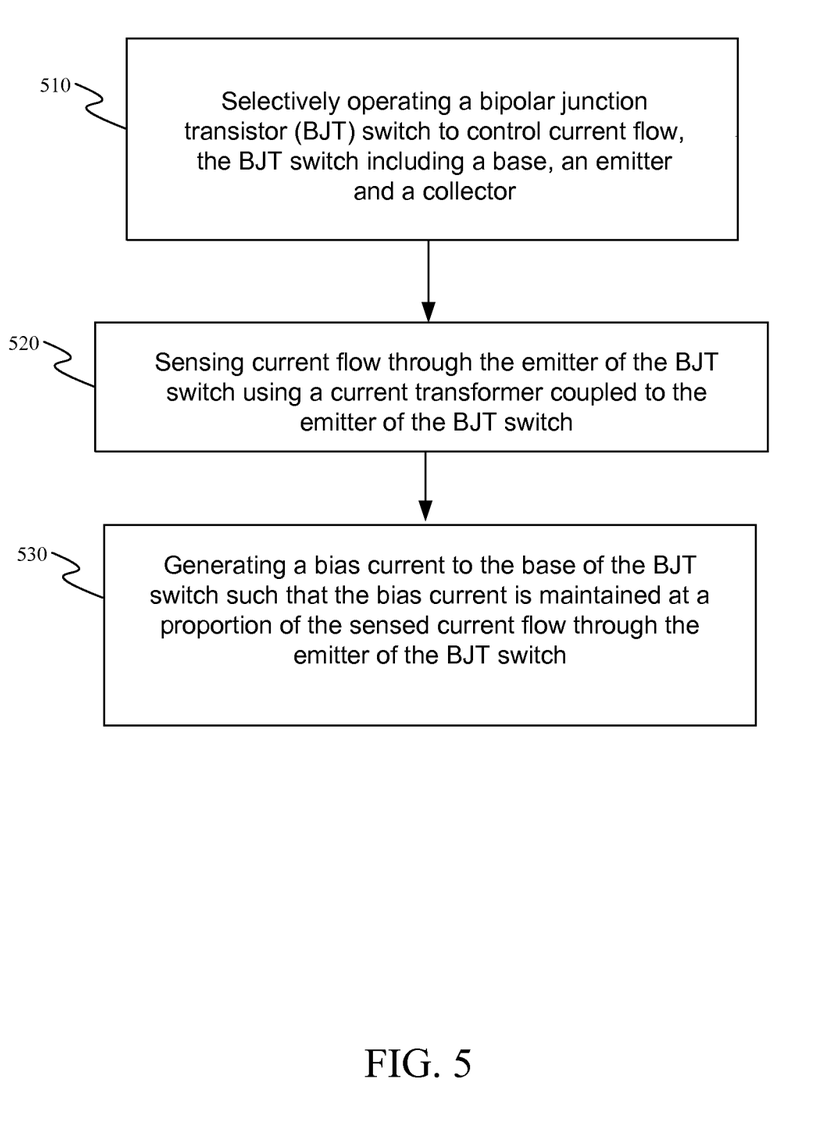
FIG. 5 illustrates a flowchart of operations of one exemplary embodiment consistent with the present disclosure.

FIG. 5 illustrates a flowchart of operations 500 of one exemplary embodiment consistent with the present disclosure. At operation 510, a BJT switch is selectively operated to control current flow. The BJT switch includes a base, an emitter, and a collector. At operation 520, current flow through the emitter of the BJT switch is sensed by a current transformer coupled to the emitter of the BJT switch. At operation 530, a bias current is generated to the base of the BJT switch. The generated bias current is maintained at a proportion of the sensed current flow though the emitter of the BJT switch.

Embodiments of the methods described herein may be implemented in a system that includes one or more storage mediums having stored thereon, individually or in combination, instructions that when executed by one or more processors perform the methods. Here, the processor may include, for example, a system CPU (e.g., core processor) and/or programmable circuitry. Thus, it is intended that operations according to the methods described herein may be distributed across a plurality of physical devices, such as processing structures at several different physical locations. Also, it is intended that the method operations may be performed individually or in a subcombination, as would be understood by one skilled in the art. Thus, not all of the operations of each of the flow charts need to be performed, and the present disclosure expressly intends that all subcombinations of such operations are enabled as would be understood by one of ordinary skill in the art.

In still other embodiments, the proportional driver circuit may be realized using digital and/or mixed signal topologies. For example, an A/D (an analog to digital) converter might be used to convert the current sense voltage V1 to a digital number. This digital number could then be used to produce a digitally derived bias current. Stacked switches may be used which may be digitally weighted as to bias value. For example, four switches would provide 16 possible drive levels. An A/D converter may be used to convert the sensed current into a digital value, and in some embodiments, additional signal processing may be employed.

The storage medium may include any type of tangible medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EE-PROMs), flash memories, magnetic or optical cards, or any type of media suitable for storing electronic instructions.

"Circuitry", as used in any embodiment herein, may comprise, for example, singly or in any combination, hardwired circuitry, programmable circuitry, state machine circuitry, and/or firmware that stores instructions executed by programmable circuitry.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A circuit module, comprising:
    a bipolar junction transistor (BJT) switch comprising a base, emitter, and collector, said BJT switch configured to provide proportional drive current to a device coupled to said collector of said BJT switch;
    a current transformer circuit comprising a first port and a second port, said first port coupled to said emitter of said BJT switch, said current transformer circuit configured to sense current flow through said device;
    a resistor having a first end coupled to said second port and said resistor having a second end coupled to said base of said BJT switch, said resistor configured to control current flow between said base and said emitter of said BJT switch;
    a proportional bias circuit configured to generate a bias current to said base of said BJT switch, said bias current maintained at a proportion of said sensed current flow through said emitter of said BJT switch; and
    a metal oxide semiconductor field effect transistor (MOSFET) switch coupled in series between said current transformer circuit and ground, said MOSFET switch configured to switch current flow through said emitter of said BJT switch, wherein said switching of said MOSFET switch is controlled by a pulse width modulation (PWM) signal provided by a power supply controller circuit.

2. The circuit module of claim 1, wherein said proportional drive current is proportional to said sensed current flow through said device.

3. The circuit module of claim 1, wherein said current transformer circuit comprises a first winding and a second winding and wherein said proportion of said sensed current flow is based on a ratio of turns in said first winding to turns in said second winding.

4. The circuit module of claim 1, wherein said current transformer circuit is an autotransformer.

5. The circuit module of claim 1, wherein said current transformer circuit is a toroid transformer.

6. The circuit module of claim 1, wherein said proportional drive current provides a bias to a switch associated with a switched mode power supply.

7. The circuit module of claim 1, wherein said proportional drive current provides a bias to a switch associated with a motor drive controller.

8. A method, comprising:
selectively operating a BJT switch to control current flow, said BJT switch comprising a base, emitter, and collector;
sensing current flow through said emitter of said BJT switch using a current transformer circuit coupled to said emitter of said BJT switch, said current transformer circuit configured to sense current;
generating a bias current to said base of said BJT switch, said bias current maintained at a proportion of said sensed current flow through said emitter of said BJT switch;
coupling a MOSFET switch in series between said current transformer circuit and ground, said MOSFET switch configured to switch current flow through said emitter of said BJT switch; and
wherein said switching of said MOSFET switch is controlled by a pulse width modulation (PWM) signal provided by a power supply controller circuit.

9. The method of claim 8, further comprising determining said proportion of said sensed current flow based on a ratio of turns in a first winding of said current transformer circuit to turns in said second winding of said current transformer circuit.

10. The method of claim 8, wherein said bias current is supplied to a switch associated with a switched mode power supply.

11. The method of claim 8, further comprising operating said BJT at voltages in a range from 1 volt to greater than 700 volts.

12. A system, comprising:
a bipolar junction transistor (BJT) switch comprising a base, emitter, and collector;
an energy storage circuit coupled to said collector of said BJT, said energy storage circuit supplying current flow to said collector of said BJT;
a current transformer circuit coupled to said emitter, said current transformer circuit configured to sense current flow through said emitter of said BJT switch;
a proportional bias circuit configured to generate a bias current to said base of said BJT switch, said bias current set to be maintained at a proportion of said sensed current flow through said emitter of said BJT switch; and
a metal oxide semiconductor field effect transistor (MOSFET) switch coupled in series between said current transformer circuit and ground, said MOSFET switch configured to switch current flow through said emitter of said BJT switch, wherein said switching of said MOSFET switch is controlled by a pulse width modulation (PWM) signal provided by a power supply controller circuit.

13. The system of claim 12, wherein said current transformer circuit comprises a first winding and a second winding and wherein said proportion of said sensed current flow is based on a ratio of turns in said first winding to turns in said second winding.

14. The system of claim 12, wherein said switching of said MOSFET is controlled by a pulse width modulation (PWM) signal provided by a motor driver controller.

15. The system of claim 12, wherein said system provides a bias to a switch associated with a switched mode power supply.

* * * * *

UNITED STATES PATENT AND TRADEMARK OFFICE
CERTIFICATE OF CORRECTION

| | | |
|---|---|---|
| PATENT NO. | : 8,981,819 B2 | Page 1 of 1 |
| APPLICATION NO. | : 13/336136 | |
| DATED | : March 17, 2015 | |
| INVENTOR(S) | : Richard A. Dunipace | |

It is certified that error appears in the above-identified patent and that said Letters Patent is hereby corrected as shown below:

Title page, in column 2, Attorney, Agent or Firm, line 2, delete "LLC" and insert -- PLLC --, therefor.

Signed and Sealed this
Twenty-first Day of July, 2015

Michelle K. Lee
*Director of the United States Patent and Trademark Office*